(12) United States Patent
Adler et al.

(10) Patent No.: US 6,476,483 B1
(45) Date of Patent: Nov. 5, 2002

(54) METHOD AND APPARATUS FOR COOLING A SILICON ON INSULATOR DEVICE

(75) Inventors: Eric Adler; James S. Dunn, both of Jericho; Kent E. Morrett; Edward J. Nowak, both of Essex Junction; Stephen A. St. Onge, Colchester, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/421,910

(22) Filed: Oct. 20, 1999

(51) Int. Cl.⁷ .............................................. H01L 23/34
(52) U.S. Cl. ...................... 257/713; 257/347; 257/717; 257/930
(58) Field of Search ................................ 257/347, 712, 257/713, 717, 930

(56) References Cited

U.S. PATENT DOCUMENTS

| | | | |
|---|---|---|---|
| 4,402,185 A | 9/1983 | Perchak ........................ 62/3.3 |
| 5,040,381 A | 8/1991 | Hazen .......................... 62/3.2 |
| 5,229,327 A | 7/1993 | Farnworth ................... 438/122 |
| 5,403,783 A | 4/1995 | Nakanishi et al. .......... 438/106 |
| 5,508,740 A | 4/1996 | Miyaguchi et al. .......... 348/244 |
| 5,714,791 A | 2/1998 | Chi et al. .................... 257/467 |
| 5,824,561 A | 10/1998 | Kishi et al. .................. 438/55 |
| 5,990,005 A | * 11/1999 | Hirose et al. ................ 438/660 |

FOREIGN PATENT DOCUMENTS

| | | | | |
|---|---|---|---|---|
| GB | 2 112 565 | * | 7/1983 | ........... H01L/23/38 |
| JP | 3-55-140257 | * | 11/1980 | ................. 257/712 |
| JP | 3-61-174749 | * | 8/1986 | ................. 257/720 |
| JP | 4-02-139952 | * | 5/1990 | ................. 257/717 |
| JP | 4-03-064050 | * | 3/1991 | ................. 257/712 |
| JP | 4-04-072746 | * | 3/1992 | ................. 257/712 |
| JP | 4-05-235127 | * | 9/1993 | ................. 438/17 |
| JP | 4-06-188342 | * | 7/1994 | ................. 257/712 |

* cited by examiner

Primary Examiner—George C. Eckert, II
(74) Attorney, Agent, or Firm—M. F. Chadurjian; E. I. Shkurko; S. Islam

(57) ABSTRACT

In an electronic device with an active region on top of and isolated from a substrate, a first material region is defined on top of and/or adjacent to and electrically isolated from the active region and a second material region is attached to a surface of the first material region to form an interface defining a Peltier cooling junction therebetween. A current source connected in series to the first and the second material regions produces a cooling effect at the Peltier cooling junction.

10 Claims, 9 Drawing Sheets

METHOD AND APPARATUS FOR COOLING A SILICON ON INSULATOR DEVICE

FIELD OF THE INVENTION

The present invention relates to a method and apparatus for cooling solid state devices; and, more particularly, a method and apparatus for providing a good heat dissipation from a thermally isolated device, such as Silicon on Insulator (SOI) devices, by using a Peltier junction.

DESCRIPTION OF THE PRIOR ART

It is well known that the speed and power output capabilities of a variety of semiconductor devices are dependent upon the carrier mobility and transit time response of these devices. It is further well known that these latter characteristics are temperature dependent. Thus, when these devices are driven beyond their upper power limits or current ratings, they may heat up to in turn reduce the levels of carrier mobility and transit time therein to thereby cause a concurrent reduction in speed and power output of these devices, and in some cases device burn-out. Thus, when these devices are mounted on lead frames or headers and encapsulated in a package, good heat transfer and heat dissipation from these devices have always been primary considerations in package design.

In the past, the use of passive cooling methods having good heat transfer characteristics and thermal dissipation characteristics for lead frames, component headers and the like has frequently been adequate for providing satisfactory heat dissipation and heat transfer for electronic devices operating within certain prescribed and normal limits of power output and operational speed. However, with the recent rapid advances in the art of integrated circuit memories, for example, where several million semiconductor devices are on a chip, there is a definite need to provide an active enhanced cooling capability for these devices in addition to the above types of passive cooling methods.

Thus, active cooling structures may be used to provide an additional kind and degree of cooling for these semiconductor devices. This enhanced cooling may be desirable, for example, to allow these semiconductor devices to operate at even greater speeds and higher powers (and higher speed-power-product figure of merit) than were heretofore possible. These devices not only include integrated circuits as indicated above having many millions of individual power transistors which, with the help of additional active cooling, would be capable of operating at significantly greater speeds and output powers than they are presently capable of operating using only passive cooling methods.

The specific type of cooling employed herein and the technical field of the present invention is that of Peltier cooling capable of using either metal-metal or metal semiconductor Peltier junctions. These junctions produce either a cooling or heating effect at the metal-metal or metal-semiconductor interface, depending upon the direction of current flowing across this interface. More specifically, there is either a cooling or heating effect depending upon the direction or current flowing thereacross. This effect had been described in many prior art patents and publications and is based upon a discovery made by Jean Peltier in 1834.

The Silicon on Insulator (SOI) devices are isolated from the bulk silicon by an insulator, usually, silicon oxide. The insulator, however, not only isolates the devices electrically, but also thermally as well, thereby making them run hotter than standard devices. Normal bulk cooling techniques are not adequate in these instances as the insulator acts as a thermal barrier.

The temperature effects of the SOI devices, e.g., NMOS and PMOS devices are well known. The mobility of the carrier is inversely proportional to the temperature as approximately $T^{-1.5}$. Thus the mobility decreases and, therefore, the resistivity increases by about 40 percent for each 100° C. temperature rise. Both the drain current and threshold voltage decrease with temperature. The transition for weak to strong inversion broadens. These effects make lower voltage devices difficult to fabricate. However at cooler temperatures the above effects reverse and the transition from weak to strong inversion becomes abrupt. This makes lower voltage device operation possible.

SUMMARY OF THE INVENTION

It is, therefore, an object of the present invention to provide an improved cooling means for a thermally isolated device.

In accordance with one aspect of the present invention, there is an electronic device, comprising:
- a substrate;
- an active region on top of and isolated from the substrate;
- a first material region on top of and/or adjacent to and electrically isolated from but thermally coupled to the active region;
- a second material region attached to a surface of the first material region to form an interface defining a Peltier cooling junction therebetween; and
- a current source connected in series to the first and the second material regions, whereby the current source produces a cooling effect at the Peltier cooling junction.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

This invention is applicable to any number of semiconductor-on-insulator devices. In accordance with one preferred aspect of the invention, the invention may be used with SOI processing technology in the fabrication of field effect transistors (FETs). The invention may be used for any number of devices which have one or more active electronic components defined in the active semiconductor layer.

Figure 1A:
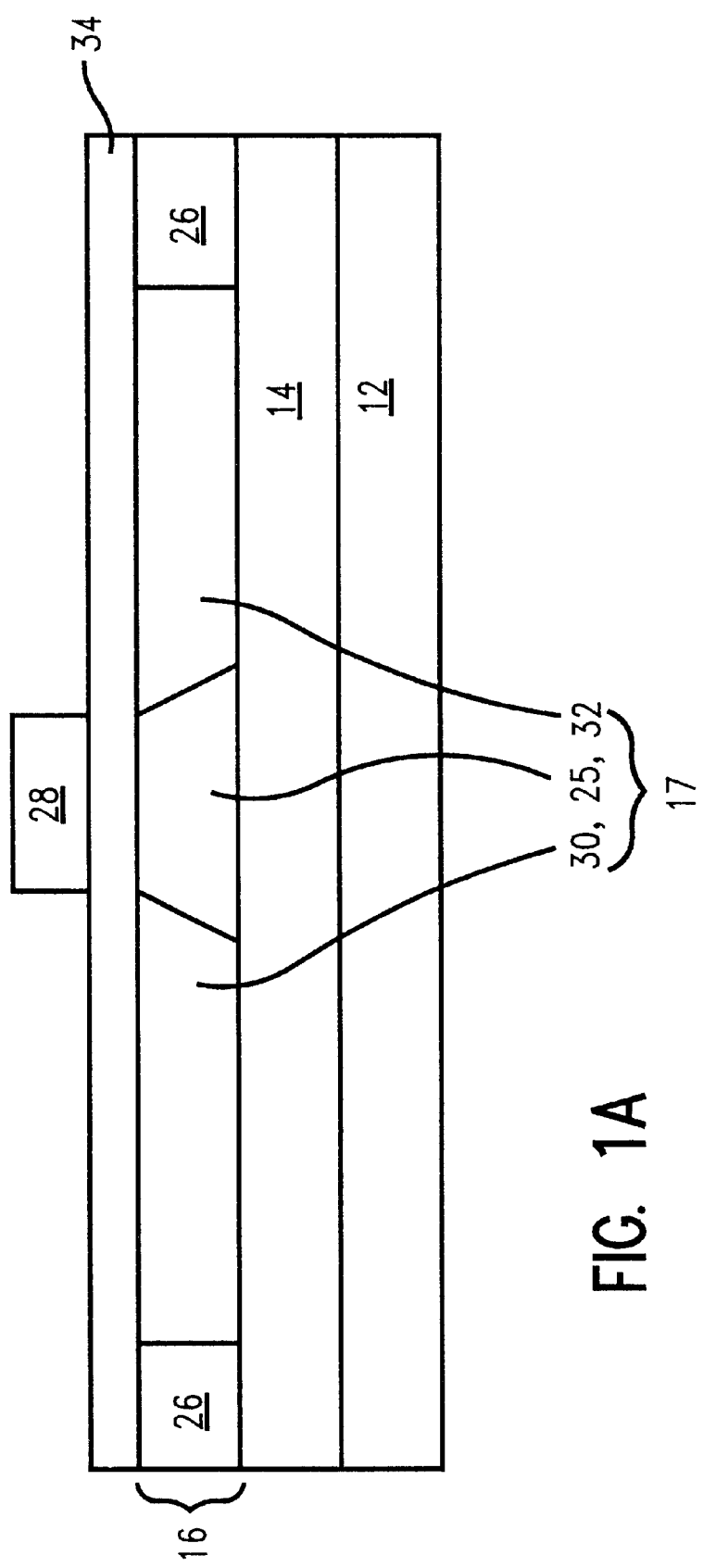
FIGS. 1A to 1C show cross section views for illustrating fabrication of an exemplary MOS device with an improved cooling means in accordance with the present invention.
Figure 1B:
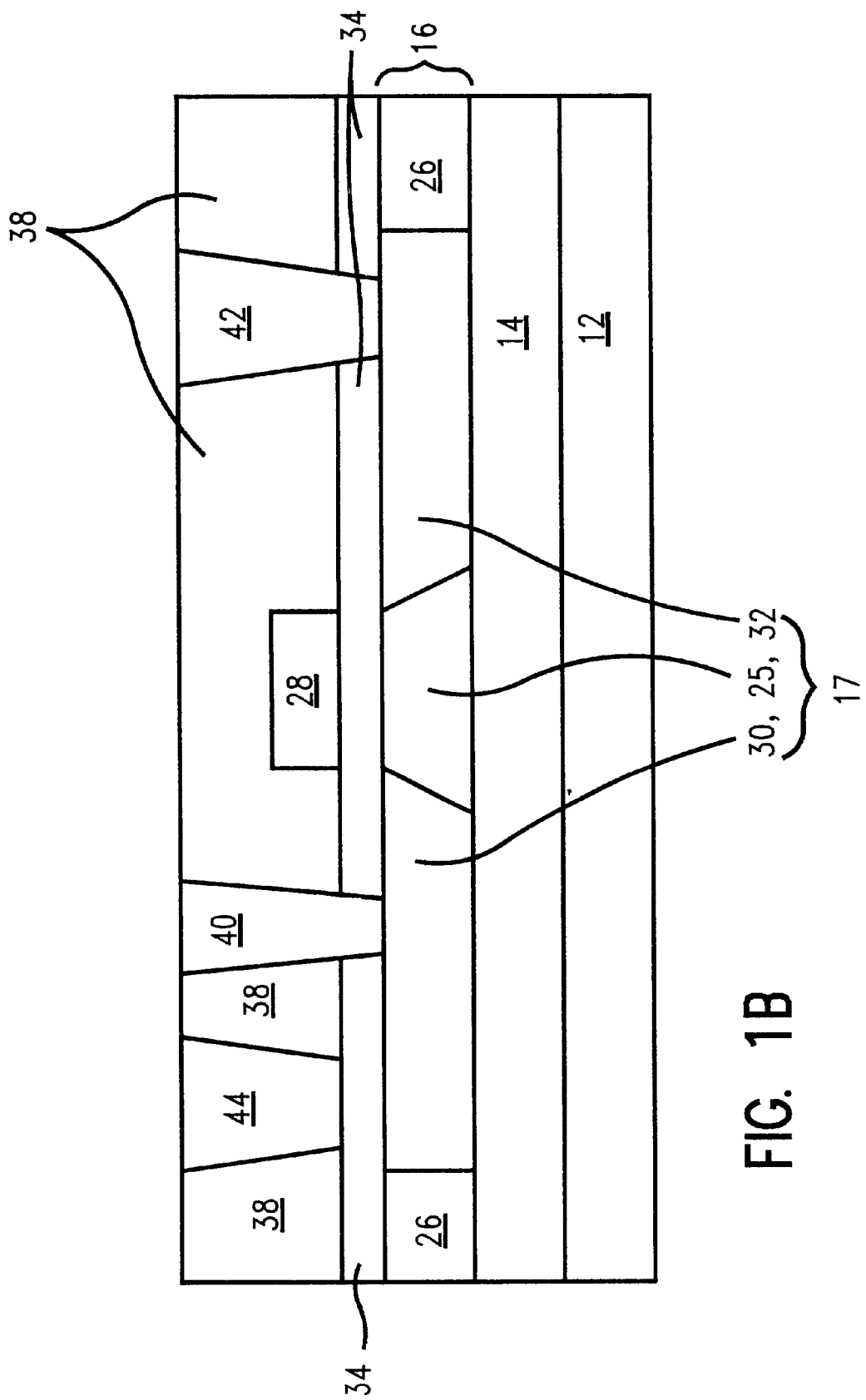
Figure 1C:
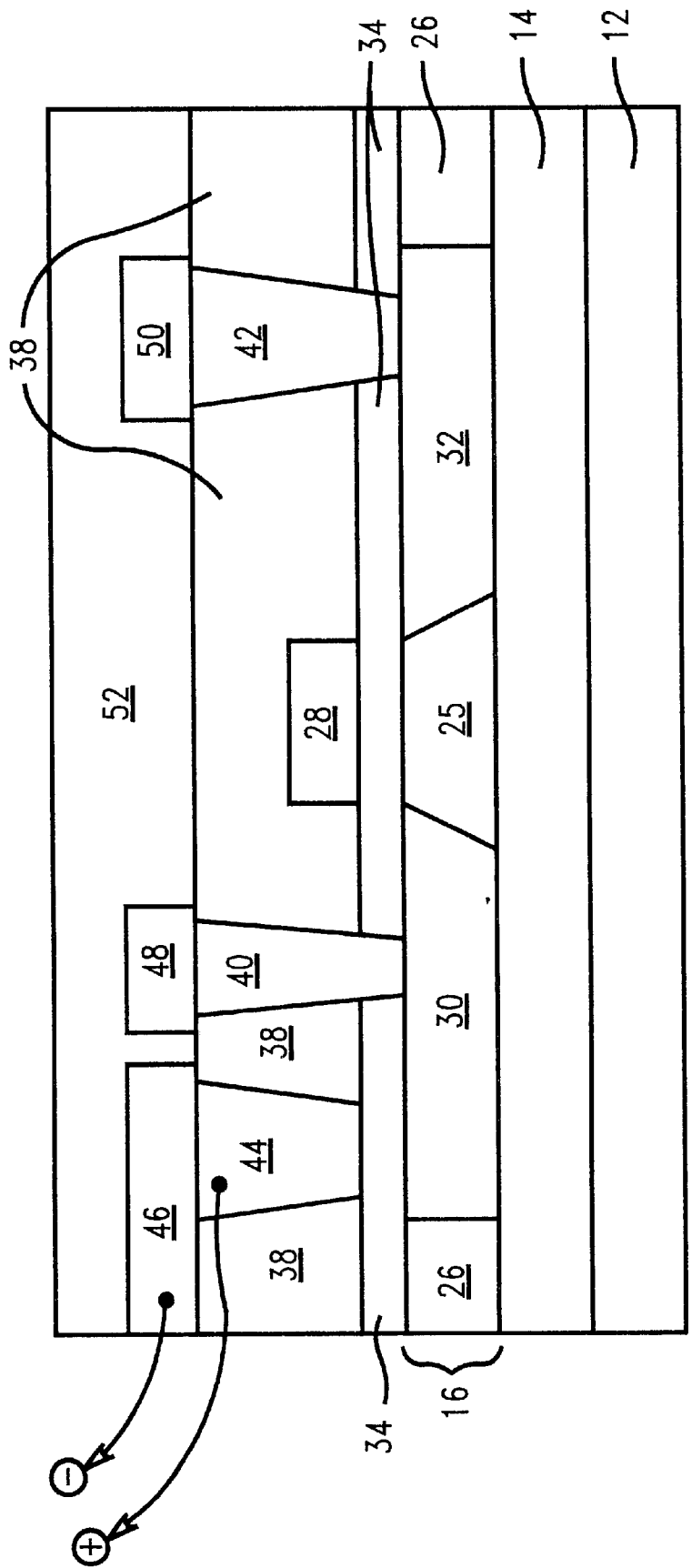

Referring to FIGS. 1A to 1C, there are illustrated cross-sectional views for describing the fabrication of a MOS device with Peltier cooling means in accordance with the invention.

Typically a Silicon-On-Insulater composite wafer is conventionally prepared by one of several well-known means, such as ion implantation of a standard bulk silicon wafer with a heavy dose of oxygen atoms (typically ~$10^{18}$cm$^{-2}$) ~0.2–1.0 um below the silicon surface followed by a high temperature anneal (typically ~1300° C.) which leaves a thick insulating silicon dioxide layer 14 between a single-crystal top silicon layer 17 (typically 0.1 to 1 um thick) and the original substrate wafer 12. Other well-known techniques include bonding a first wafer onto a second wafer with thick oxide predisposed upon the second wafer followed by thinning of the top wafer to the desired final silicon thickness. Any of these, and other, techniques are applicable to this invention.

To define an isolation volume 26 surrounding the active region 17 in the active silicon region 16, a photoresist (not drawn) is developed and removed over the volume which is to be the isolation volume 26. The exposed active silicon in the isolation volume 26 is then removed by etching. The active silicon is etched down to the insulating layer 14. The opening is then fabricated into the isolation volume 26 by refilling with an insulating material such as silicon dioxide using bulk processing methods such as chemical vapor deposition which provides conformal deposition of the material.

As an exemplary embodiment, the active region 17 includes a MOSFET. To form a transistor gate 28 for each transistor, the photolithographic mask used to form the isolation volume 26 is removed and a silicon dioxide layer 34 is reformed over the isolation volume 26 and on the active silicon layer region 17. "P-type FET regions may be covered while a p-type dopant (typically $10^{12}$ cm$^{-2}$ boron) is introduced (usually via ion implantation) into the n-MOSFET fet silicon regions to achieve the desired n-MOSFET behavior (threshold voltage and punch-through suppression). This masking resist is striped and the N-type FET regions are then covered while similar n-type dopants (typically ~$10^{12}$ cm$^{-2}$ phosphorus and/or arsenic) are introduced (again usually by ion implantation) into the P-MOSFET regions again to achieve the desired FET characteristics. To complete the transistor gate 28, a polysilicon layer is then deposited over the silicon dioxide layer 34. A photoresist may then be deposited and patterned to form the gate 28 from the polysilicon layer. An implant mask(not shown) is then formed. The implant mask allows for the implanting of either n+ type or p+ type ions to define source 30 and drain 32 regions in the active silicon region 17.

In forming the source 30 and drain 32 for the transistors, the ions may generally be diffused in the intended region to the interface between the active silicon 16 and the insulating layer 14. Therefore, a channel region 25 by which the source and the drain regions are separated from each other in the active region 17 may be generated. Alternatively, the formed source and drain regions 30 and 32 may penetrate only partially into the active silicon layer 16. In operation this partial diffusion provides definite characteristics in conjunction with the transistors. When the source and drain region 30 and 32 of ions only partially penetrate the active silicon layer 16, the active region 17 extends into the area over which there will exist a Peltier cooling junction as illustrated below.

Once the active region 17 is formed, an oxide layer 38 may be deposited as shown in FIG. 1B. The oxide layer 38 functions to stabilize the active region 17 for further processing, electrically isolating the active region. The oxide layer 38 is etched to expose openings for a source and a drain contact studs 40 and 42. Two openings are formed to expose portions of the source and drain regions, respectively. The two openings are, then, filled with a conductive material, such as tungsten (W), to form the source and the drain contact studs.

In accordance with the present invention, in order to form a thermal pass for dissipating heat generated in the active region 17, a first material region 44 of Peltier cooling means is formed as a stud type on top of and electrically isolated from a portion of the source region 30 which has not used for the source contract stud 40. The source region 30 may need to be wider than normal to accommodate the Peltier cooling means. In order to define the first material region, the oxide layer 38 is patterned and etched to expose an opening over a portion of the upper surface of the silicon under which a portion of the source region is located. A thin nitride is deposited in the exposed opening over the silicon dioxide layers, 38 and 34 and the opening is then filled with a metal such as W and planerized to define the first material region 44.

Referring to FIG. 1C, a metal layer of aluminum is deposited over the source and the drain contact studs 40 and 42 and the first material region 44 and, then, patterned to define wiring layers 48 and 50 and a second metal region 46 of the Peltier cooling means, respectively. The wiring layer 48 and 50 provide an operating voltage for the active region through the source and drain contact studs 40 and 42. The lower surface of the second metal region 46 is attached to the upper surface of the first material region 44 so that an interface defining a Peltier cooling junction therebetween is formed. A pair of wires (not shown) of the same materials (e.g. W and A1) as the peltier junction wires are used to connect the first and the second material regions 44 and 46 in series with the Peltier cooling junction. Finally, an oxide layer 52 is formed over the wiring layers 48 and 50 and the second material region 46.

Figure 2:
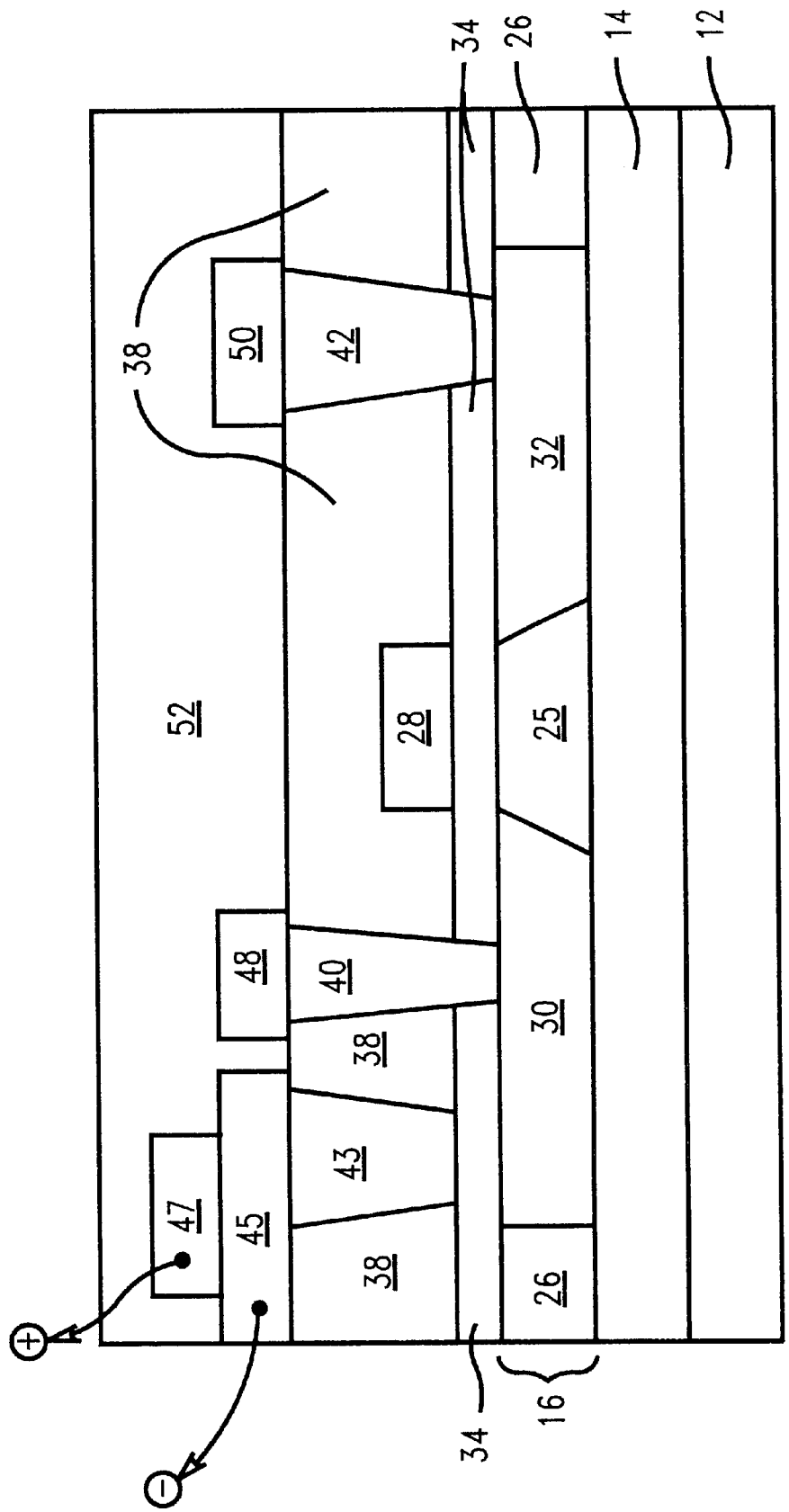
FIG. 2 represents a cross section view for showing another exemplary MOS device with another cooling structure in accordance with the present invention.

Referring to FIG. 2, there is illustrated another embodiment of the Peltier device on the silicon-on-insulator. After the oxide layer 38 is deposited as described in FIG. 1B, the source and drain contact studs 40 and 42 and a thermal conducting stud 43 are formed, wherein the thermal conducting stud 43 is formed by using the same method as the first material region 44 shown in FIG. 1B. In accordance with the present invention, a metal layer of aluminum is deposited over the source and the drain contact studs 40 and 42 and the thermal conducting stud 43 and, then, patterned to define a first material region 45 of the Peltier cooling means. The second material region 47 of the Peltier cooling means is deposited on a portion of the first material region 45 so that an interface defining a Peltier cooling junction therebetween is formed. A pair of wires (not drawn) are used to connect the first and the second material regions 45 and 47 in series with the Peltier junction.

Figure 3:
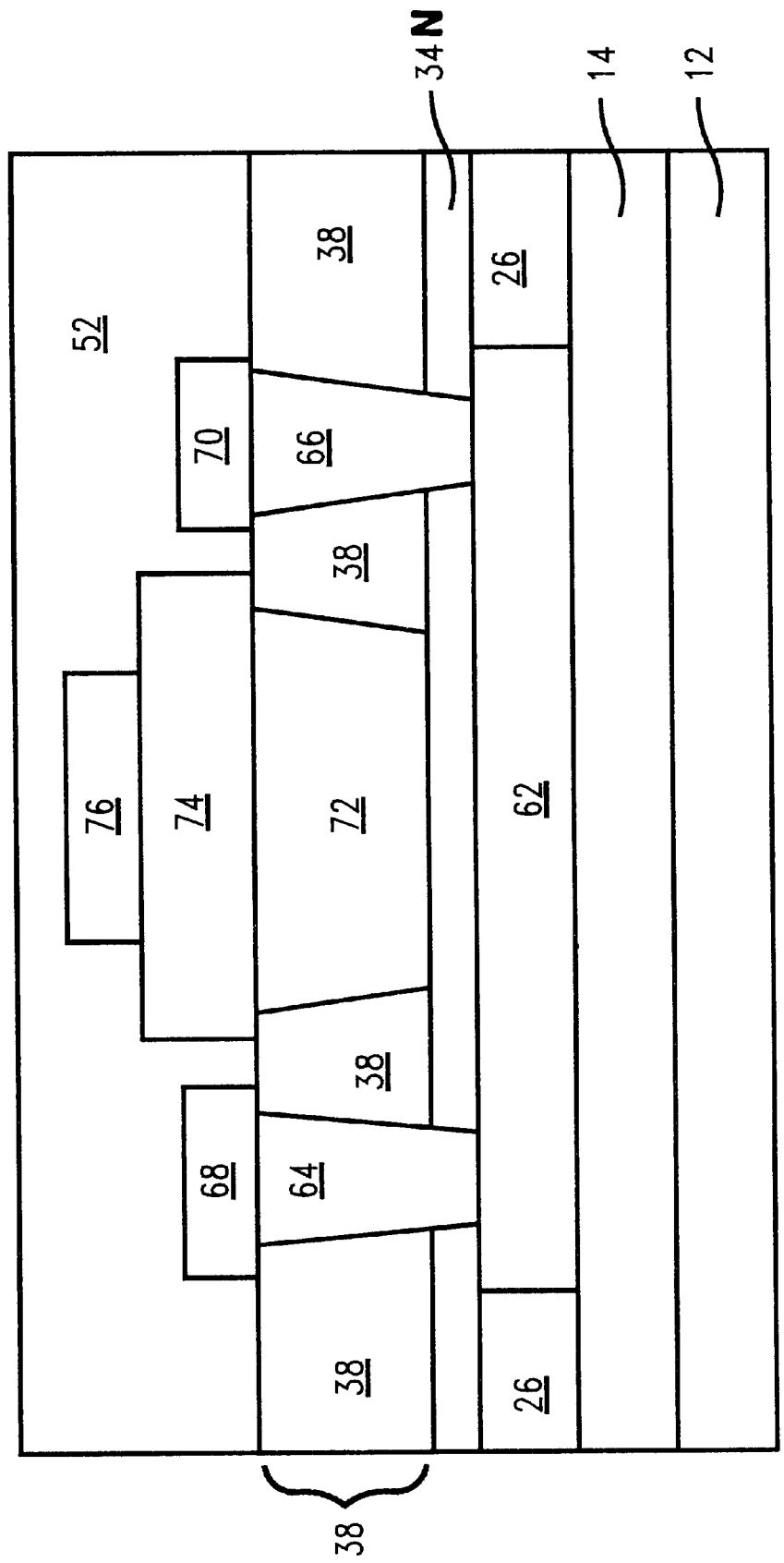
FIG. 3 is a cross section view for a resistor with a cooling structure in accordance with the present invention.

Referring to FIG. 3, There is another embodiment of the Peltier cooling means incorporated in a resistor. An insulting layer 14 is formed on a substrate 12 and a single crystal resistor or a polysilicon resistor 62 is defined on the insulating layer 14. After an isolation volume 26 surrounding the resistor 62 is defined, a silicon nitride layer 34N and an oxide layer 38 are sequentially deposited over the isolation volume 26 and the resistor 62. The oxide layer 38 is etched to expose openings for two contact studs 64 and 66.

The two openings are defined over two ends of the upper surface of the resistor 62 and filled with a conductive material such as tungsten to form the two contact studs 64 and 66 for the resistor 62. Two wiring layers 68 and 70 are defined over the two contact studs 64 and 66, respectively, so that an operating voltage is applied to the resistor 62 through the two wiring layers 68 and 70.

In accordance with the present invention, in order to form a thermal path for dissipating thermal energy generated in the resistor 62 surrounded by the isolation means 26, a thermal conducting stud 72 of the Peltier cooling means is formed on top of and electrically isolated from a portion of the resistor 62 which has not been used for the two contact studs 64 and 66. The thermal conducting stud 72 is made of the same material metal, e.g., tungsten, as the two contact studs 64 and 66.

A first material region 74 is defined over the thermal conducting stud 72 by using a conventional deposition and patterning technique and a second material region 76 is defined over the first material region 74 so that the lower surface of the second metal region 76 is attached to the upper surface of the first material region 74 to form an interface defining a Peltier cooling junction therebetween. The first and the second material regions 74 and 76 may be any pair selected from Al, W, or Cu, to name a few. Finally, an oxide layer 52 is deposited above the entire structure.

Figure 4A:
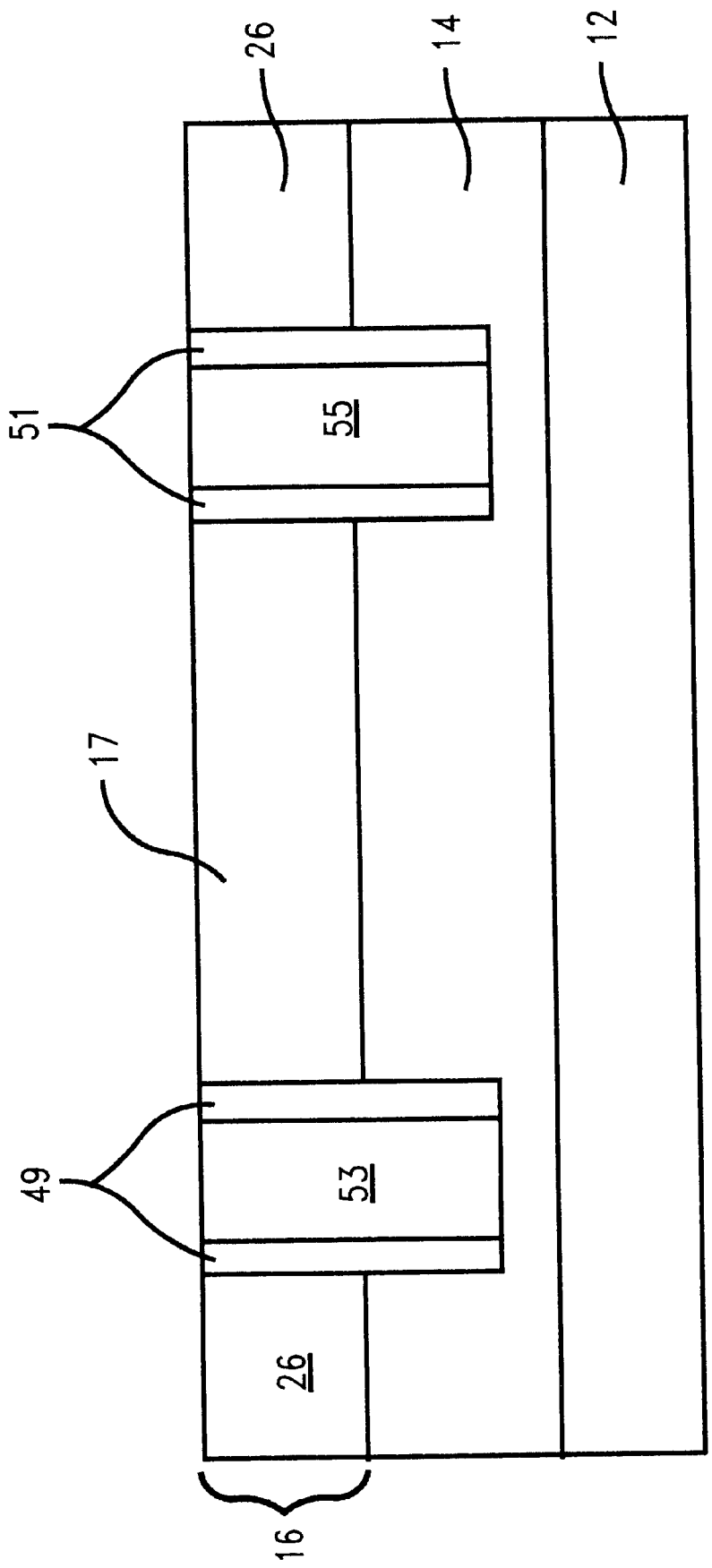
FIGS. 4A to 4D are cross sectional views for describing the fabrication of the invention with the cooling means attached to the side of a MOS device.
Figure 4:
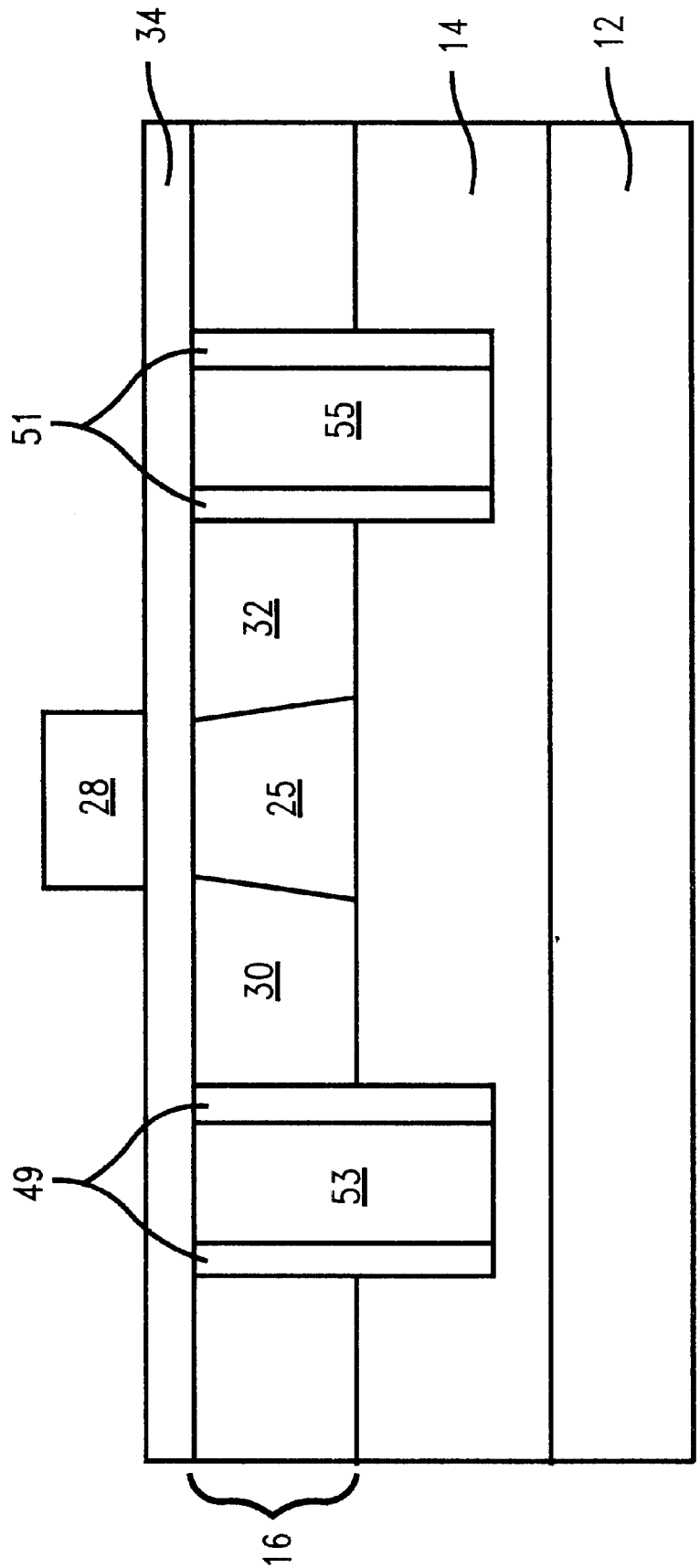
Figure 4C:
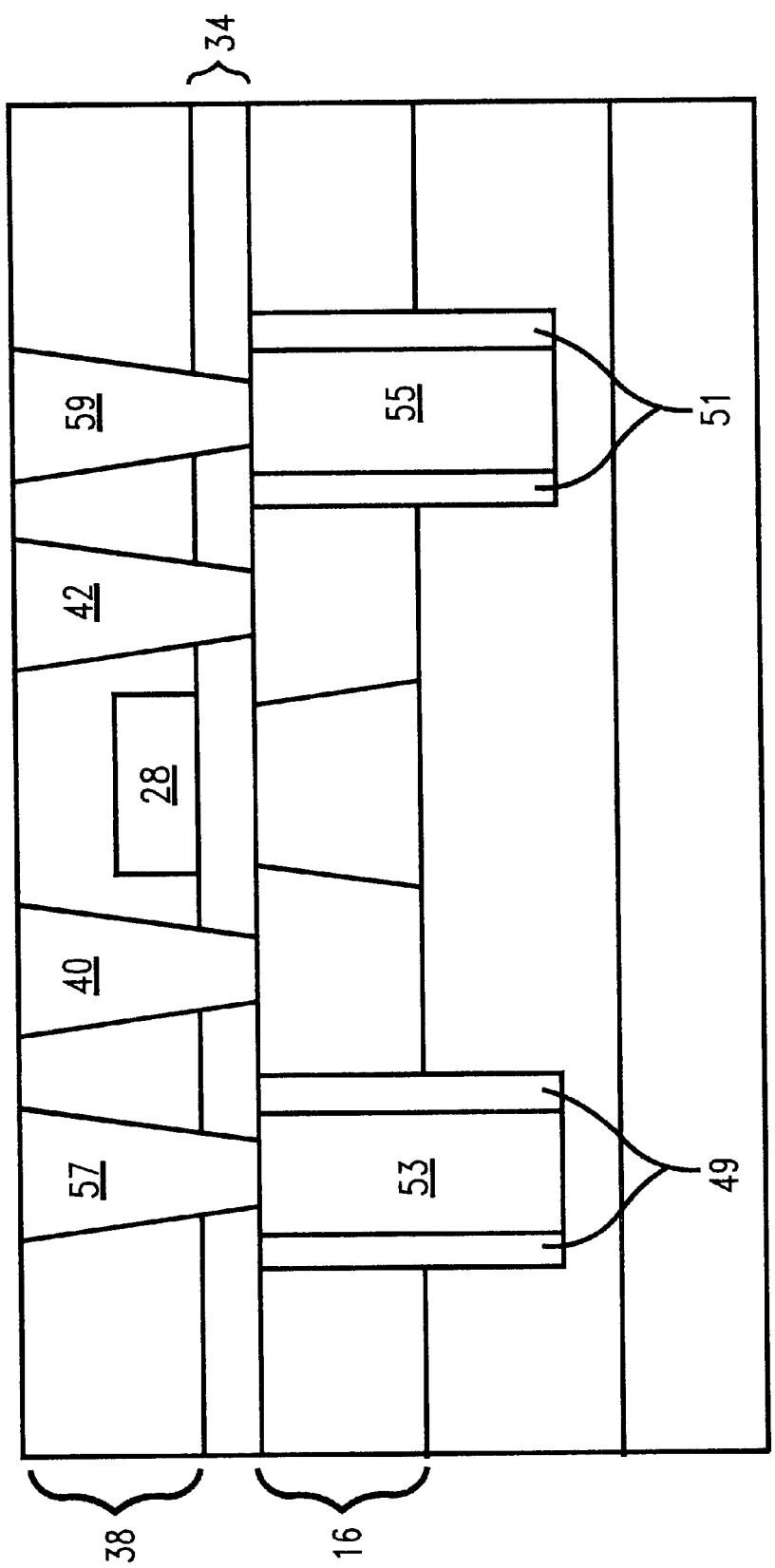

Referring to FIGS. 4A to 4C, there are illustrated cross-sectional views for describing the fabrication of another MOS device with Peltier cooling means in accordance with the invention.

A substrate 12 with an insulating layer 14 is prepared with an active layer 16 is grown on the insulating layer 14, as per the prior device described in this work. Preferably, the insulating layer 14 comprises silicon oxide. In the active layer 16, an isolation volume 26 is defined around an active region 17 so that the active region is electrically and thermally isolated from the environment through the isolation volume 26.

At the boundary (not shown) between the active region 17 and the isolation volume 26, one or more first material regions 53 and 55 are defined in accordance with the present invention.

First of all, one or more trenches are defined contacting the active region 17 from the side by using a conventional patterning and etching techniques. Thin silicon nitride insulators 49 and 51 are formed on the sidewalls of the trench to isolate the active region 17 from the first material regions 53 and 55. The silicon nitride insulators 49 and 51 formed by spacer processes are conformally formed around the sidewalls of the one or more trenches, which are then filled with a conducting material to define the first material regions 53 and 55 of the Peltier cooling means. Note that the silicon nitride insulators 49 and 51 between the active region 17 and the first material regions 53 and 55 are so thin that the first material regions 53 and 55 may be thermally conductive to but electrically isolated from the active region 17.

In the preferred embodiment of the field effect transistors as shown in FIG. 4B, an insulating layer 34 is deposited over the active silicon layer 16 including the isolation volume 26, the spacer 49, the first material region 53 and 55 and the active region 17. After the transistor gate 28 is defined over the active region 17, a source 30, a drain 32 and a channel regions 25 are defined in the active region 17 by using a conventional ion implanting technique as described above.

Once the active region is defined as described above, an oxide layer 38 may be deposited as shown in FIG. 4C. The oxide layer 38 is partially etched to expose openings for two contact studs 40 and 42. The two openings are formed to expose portions of the source and drain regions. The two openings are, then, filled with a conductive material, such as tungsten, to form a source and a drain contact studs 40 and 42.

In accordance with the present invention, second material regions 57 and 59 of the Peltier cooling means are formed over portions of the first material regions 53 and 55, respectively. In order to define the second material regions 57 and 59, the oxide layer 38 is patterned and etched to expose a portion of the upper surface of the first material regions 53 and 55. The exposed openings are filled with a metal such as aluminum and planerized. The lower surface of the second metal regions 57 and 59 must be attached to the upper surface of the first material regions 53 and 55 so that an interface defining a Peltier cooling junction therebetween is formed.

Figure 4D:
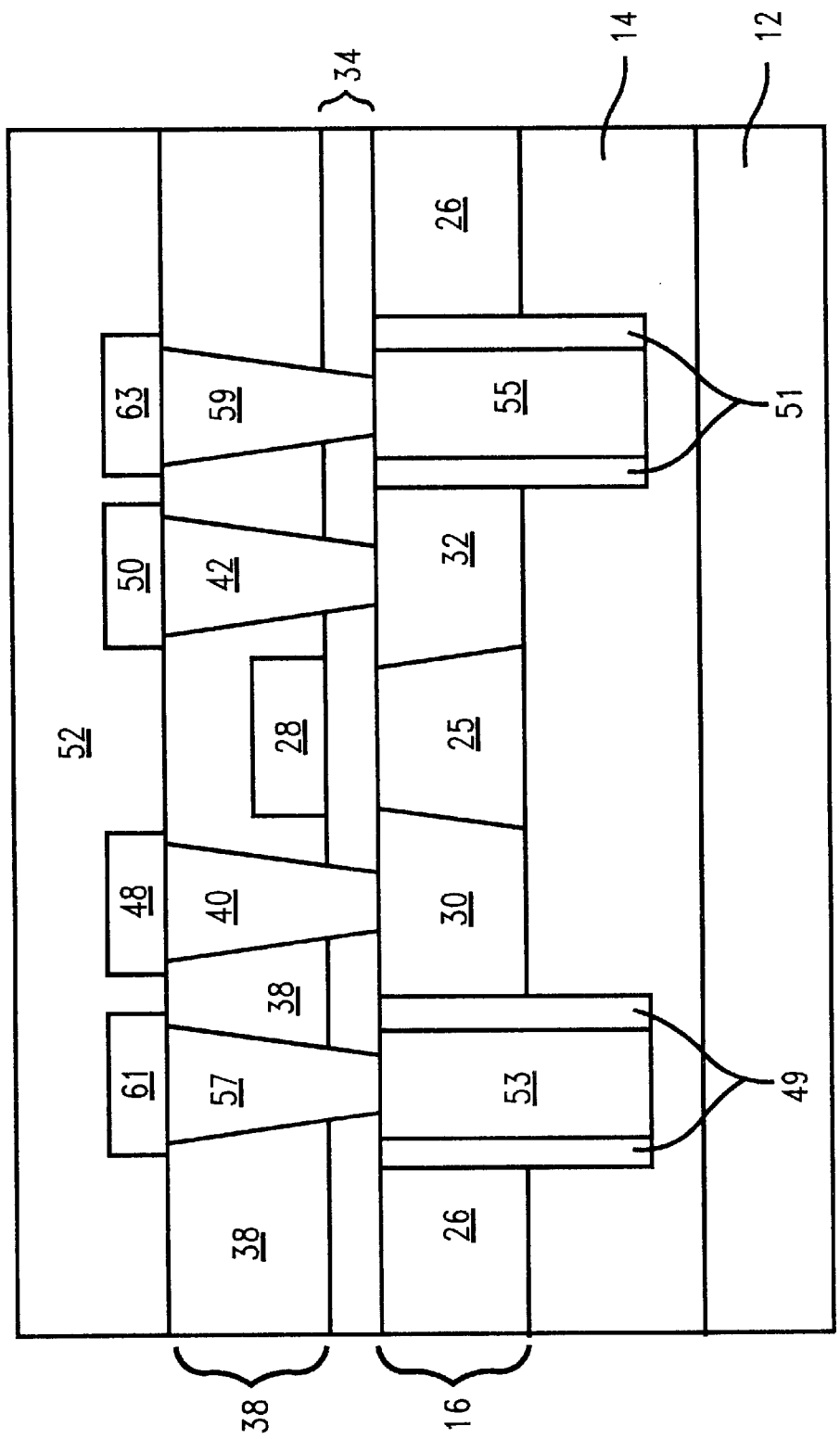

Referring to FIG. 4D, a metal layer of aluminum is deposited over the contact studs 40 and 42 and the second material regions 57 and 59 and, then, patterned to define wiring layers 48, 50, 61 and 63. Some wiring layers 48 and 50 are used to provide an operating voltage of the active region. The other two wiring layers 61 and 63 are used to apply an operating voltage of the Peltier cooling means to the second material regions 57 and 59, respectively. Two wires (not drawn) are used to connect the first material regions 53 and 55 in series with the Peltier junction, respectively. Finally, an oxide layer 52 are formed.

While the present invention has been described with respect to the particular embodiments, it will be apparent to those skilled in the art that various changes and modifications may be made without departing from the spirit and scope of the invention as defined in the following claims.

What is claimed is:

1. An electronic device, comprising:
   a substrate;
   an active region on top of and isolated from the substrate;
   a first material region on top of and/or adjacent to and electrically isolated from the active region;
   a second material region attached to a surface of the first material region to form an interface defining a Peltier cooling junction therebetween;
   a current source connected in series to the first and the second material regions, whereby the current source produces a cooling effect at the Peltier cooling junction and said Peltier cooling junction forms a stud insulated from diffusion.

2. The device of claim 1, wherein the active region includes silicon on oxide.

3. The device of claim 2, wherein the silicon on oxide is selected from a group of a transistor, a resistor, and a capacitor.

4. The device of claim 1, wherein said active region includes silicon on oxide which includes a transistor comprising MOS.

5. The device of claim 1, further comprising a thin insulating structure located between the active region and the first material region for electrically insulating therebetween.

6. The device of claim 5, wherein the thin insulating structure is silicon nitride.

7. The device of claim 5, wherein the first material region is a shallow isolation trench electrically isolated from the active region.

8. The device of claim 7, wherein the thin insulating structure is a spacer.

9. The device of claim 1, wherein the first and the second material regions are made of a pair of metals selected from Al, W and Cu.

10. The device of claim 1, further comprising a conducting stud electrically isolated from the active region and acting as a thermal conductor between the active region and the first material region, said stud insulated from a diffusion layer.

* * * * *